United States Patent [19]

Zommer

[11] Patent Number: 4,931,844

[45] Date of Patent: Jun. 5, 1990

[54] HIGH POWER TRANSISTOR WITH VOLTAGE, CURRENT, POWER, RESISTANCE, AND TEMPERATURE SENSING CAPABILITY

[75] Inventor: Nathan Zommer, Palo Alto, Calif.

[73] Assignee: IXYS Corporation, San Jose, Calif.

[21] Appl. No.: 223,059

[22] Filed: Jul. 22, 1988

Related U.S. Application Data

[63] Continuation-in-part of Ser. No. 165,692, Mar. 9, 1988, abandoned.

[51] Int. Cl.$^5$ ............................................. H01L 29/78
[52] U.S. Cl. ................................. 357/23.4; 307/242; 307/575; 307/584; 323/317
[58] Field of Search ............... 357/23.4; 307/242, 575, 307/584; 323/317

[56] References Cited

U.S. PATENT DOCUMENTS

| | | | |
|---|---|---|---|
| Re. 30,173 | 12/1979 | Ahmed | 330/257 |
| 4,599,554 | 7/1986 | Jaycox et al. | 307/584 |
| 4,680,490 | 7/1987 | Baker et al. | 307/575 |
| 4,682,195 | 7/1987 | Yilmaz | 357/23.4 |
| 4,694,207 | 9/1987 | Hevwieser et al. | 307/571 |
| 4,779,123 | 10/1988 | Bencuya et al. | 357/23.4 |
| 4,783,690 | 11/1988 | Walden et al. | 357/23.14 |
| 4,785,207 | 11/1988 | Eng | 307/246 |
| 4,811,065 | 3/1989 | Logan | 357/23.4 |

OTHER PUBLICATIONS

Nathan Zommer and Joseph Biran; "Power Current Mirror Devices and Their Applications"; *PCI*; Jun., 1986, pp. 275-283.

*Primary Examiner*—Joseph E. Clawson, Jr.
*Attorney, Agent, or Firm*—Townsend and Townsend

[57] ABSTRACT

One or more probe cells are use to sense voltage and current accurately and without affecting performance of the switching device ($T_1$) or the load. In addition, power, resistance, and temperature can be determined from the voltage and current. Voltage sensing is accomplished by placing a large value resistor ($R_3$) (much greater than the on-resistance of the probe cell(s)) between the probe cell(s) and its low voltage connection (the common source terminal in the case of MOSFET's). Since the resistor ($R_3$) is much greater than the cell resistance, the voltage across the resistor is nearly equal to the voltage across the power chip (10). Current probe cells are isolated from switching cells (27) in MOSFET power chips. The cell locations adjacent the probe cells are occupied by cells (50) that are inactive by virtue of their not having had a source region implanted therein during the chip fabrication. This isolation prevents any crosstalk between probe and switching cells.

11 Claims, 2 Drawing Sheets

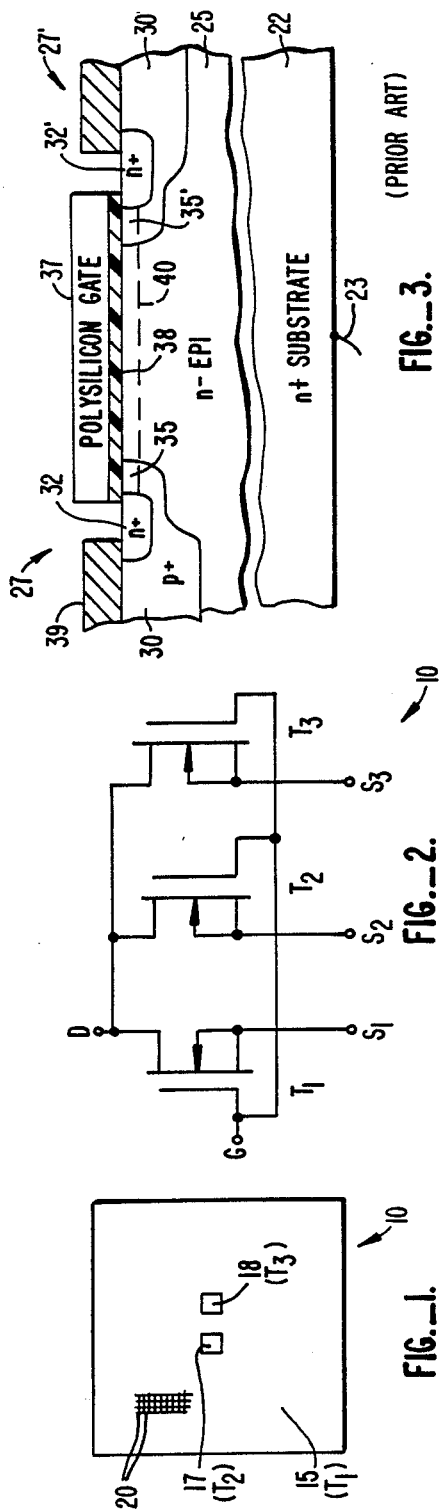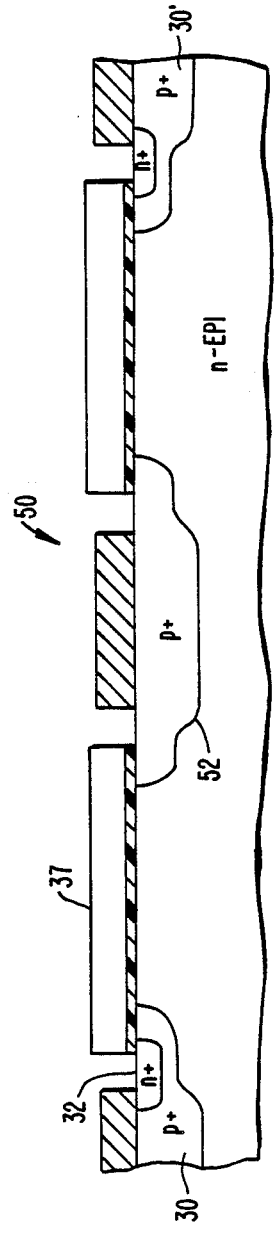

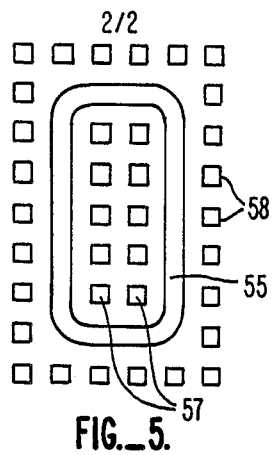
FIG._5.
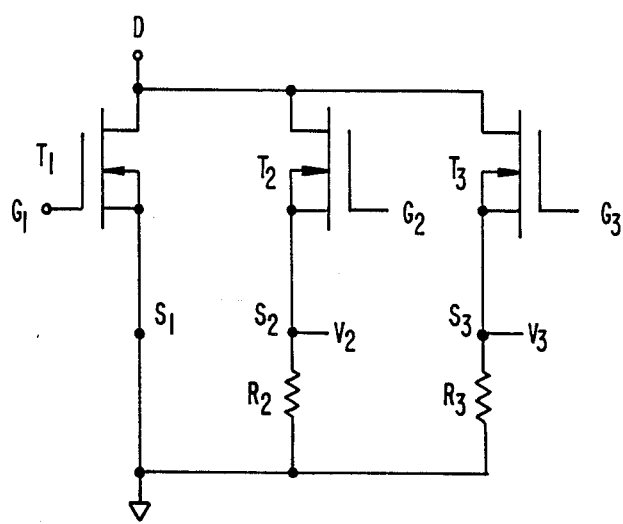
FIG._6.
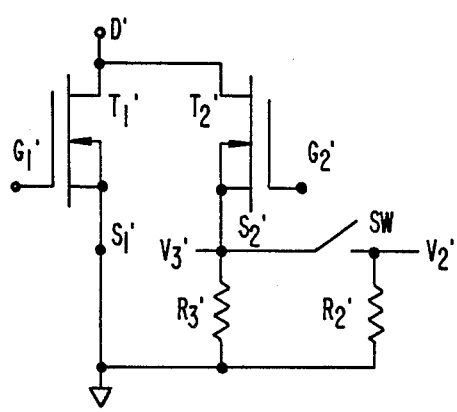
FIG._7.

HIGH POWER TRANSISTOR WITH VOLTAGE, CURRENT, POWER, RESISTANCE, AND TEMPERATURE SENSING CAPABILITY

This is a continuation-in-part of U.S. application Ser. No. 165,692, filed Mar. 9, 1988, for "HIGH POWER TRANSISTOR WITH VOLTAGE, CURRENT, POWER, RESISTANCE, AND TEMPERATURE SENSING CAPABILITY," now abandoned.

BACKGROUND OF THE INVENTION

Power MOSFET's are often implemented as an array of switching cells (perhaps 10,000 in number) formed on a single chip and connected in parallel. Such devices are used in electronic circuits for switching and controlling electrical power to desired loads. In such applications, it is often desirable to sense the current through the device and the load, the voltage across the device, the power dissipated in the device, and the temperature of the device. The results of such sensing can be used to detect device and load efficiency, short circuit conditions, meltdown conditions, etc.

Voltage sensing has typically consisted of connecting external sensing circuitry to the high voltage lead of the power chip (for example, the drain in the case of a MOSFET). However, such sensing circuitry may affect the performance of the switch or load, may have poor reliability or accuracy, and tends to use expensive components. In addition, the circuitry should be gated and protected from the high voltage transients of the switch and load, which requires even more complex and expensive circuitry.

Current sensing has typically been accomplished by using a power resistor in series with the power switching device or the load, and sensing the voltage across the resistor. However, power resistors dissipate large amounts of power, affecting the performance of the switch and load, and resulting in excess heat and inaccurate results. Although some of these power dissipation problems can be overcome by utilizing 5-watt resistors in the 10-20 milliohm range, such resistors are expensive and difficult to make. Magnetic coils have also been utilized to sense the current via magnetic induction. However, such coils are inaccurate and insert parasitic inductance into the circuit, again affecting the accuracy of the data.

Power dissipation and resistance of the power chip have been sensed by using a combination of prior art voltage and current sensing techniques. This has all the disadvantages of both the voltage sensing techniques and the current sensing techniques discussed above.

Temperature sensing has typically been accomplished utilizing a forward biased p/n junction on the power chip. Such a junction requires a separate current source which complicates the design and construction of the power chip. Moreover, the sensing is usually done when the main device is off. In order to sense temperature when the device is on, more complex circuitry is needed either on or off the chip.

More recently, the "current mirror" technique has been introduced for current sensing in power MOSFET's. In this technique, a small number of the cells on the chip ("probe cells") have their terminals connected in common with each other, but separate from the terminals of the remaining cells. The current flowing through these probe cells represents a small fraction of the total current flowing through the main portion of the chip. This current can be measured by measuring the voltage across a resistor placed in series with the probe cells. Since the current is so small, a larger valued standard resistor can be used. The current mirror technique does not affect the performance of the switch or load because very little power is drained from a few cells. However, problems due to crosstalk between the probe cells and switching cells have limited the accuracy of the technique.

SUMMARY OF THE INVENTION

The present invention utilizes current mirrors (sometimes referred to simply as "mirrors") having one or more probe cells to sense voltage and current accurately and without affecting performance of the switching device or the load. In addition, power, resistance, and temperature can be determined from the voltage and current.

Voltage sensing utilizes a current mirror having one or more probe cells, and is accomplished by placing a large value resistor (much greater than the on-resistance of the mirror) between the mirror and its low voltage connection (typically, the common source terminal). Since the resistor is much greater than the mirror resistance, the voltage across the resistor is nearly equal to the voltage across the power chip. Utilizing a current mirror to sense voltage in this manner has a minimal effect upon the performance of the switch or load, and is very accurate.

The present invention also isolates the current probe cells from the switching cells in the MOSFET. The cell locations adjacent the probe cells are occupied by so-called dummy cells that are inactive by virtue of their not having had a source region implanted therein during the chip fabrication. An alternative embodiment utilizes a guard ring surrounding the probe cells. The dummy cells or guard ring provide a degree of isolation that substantially prevents crosstalk between probe and switching cells. Therefore, current through the switch and load can be accurately determined with minimal effect upon the performance of the switch or the load.

The power dissipation and the on-resistance of the power chip can now be accurately determined because both the voltage and current can be sensed accurately. In addition there is no interference with the performance of the switch and load. The temperature of some power chips (such as power MOSFET's with DMOS cells) can also be determined if the power chip has a known temperature versus resistance relationship. Again, there is no interference with the performance of the switch or the load.

A further understanding of the nature and advantages of the present invention may be realized by referring to the remaining portions of the specification and the attached drawings.

BRIEF DESCRIPTION OF THE DRAWINGS

FIG. 1 is a stylized top view of a MOSFET chip having two current mirrors for current and voltage sensing;

FIG. 2 is circuit schematic of the chip of FIG. 1;

FIG. 3 is a schematic sectional view of a prior art current mirror device;

FIG. 4 is a schematic sectional view illustrating the use of isolation cells according to the present invention;

FIG. 5 is a top plan view illustrating the use of a guard ring according to the present invention;

FIG. 6 is a circuit schematic of the chip of FIG. 1 with external circuitry for providing current, voltage, power, and temperature sensing; and FIG. 7 is a circuit schematic of an embodiment of the chip having a single current mirror with circuitry for current and voltage sensing.

DESCRIPTION OF THE PREFERRED EMBODIMENT

FIG. 1 is a top view showing, in stylized form, a MOSFET power chip 10 having current and voltage sensing capabilities. For simplicity, bond pads and external connections are not shown. A major part 15 of the chip area is devoted to the main transistor switch, designated $T_1$. A pair of smaller areas 17 and 18 are devoted to second and third transistors defining first and second current mirror transistors designated $T_2$ and $T_3$. According to well known power MOSFET practice, each of the transistors is actually implemented as a number of small MOSFET cells 20.

In operation, the current mirror cells tend to carry more current per cell than the main transistor cells carry per cell. The reason for this is that the mirror region has a higher periphery-to-area ratio than the main transistor. The current through the peripheral cells can spread laterally beyond the cell boundaries and thus sees less ohmic resistance than the current through interior cells. For example, with a dual row of mirror cells and cell count ratio of 1000:1, it is observed that the current ratio is about 700:1. In the illustrative embodiment, main transistor $T_1$ has 10,000 cells, current mirror transistor $T_2$ has 10 cells, and current mirror transistor $T_3$ has two cells. In some applications, current mirror transistor $T_3$ might contain only one cell.

FIG. 2 is a circuit schematic of chip 10. The cells in main transistor $T_1$ are connected in parallel with their gates in common, their sources in common, and their drains in common. Similarly, each of current mirrors $T_2$ and $T_3$, contains a plurality of cells connected in parallel. For the present application, the three transistors have their drains commonly connected to a node D and their gates commonly connected to a node G. Transistors $T_1$, $T_2$, and $T_3$ have separate source nodes $S_1$, $S_2$, and $S_3$.

Current mirrors in the prior art have had a problem with crosstalk. In order for a current mirror to provide a reliable signal, it is important that the mirror cells' sources be isolated from the main switch cells' sources. FIG. 3 is a cross-sectional view showing portions of adjacent main transistor and current mirror cells, and the problem associated therewith. The chip is formed on an n+ substrate 22 having a common drain connection 23 on the bottom side. An n− epitaxial ("epi") layer 25 is deposited on the top side of the substrate. A cell 27 of the main transistor comprises a p/p+ body 30 formed in epi layer 25 and an n+ source region 32 formed within the perimeter of body 30. The portion of body 30 adjacent the surface and between the source region and the n− epi defines a channel region 35. A polysilicon gate 37 overlies the channel region and is separated from it by a thin layer 38 of gate oxide. A metal connection 39 connects source region 32 to a source node (not shown). The mirror cell is similarly configured, and primed reference numerals are used to show its corresponding elements.

In operation, a potential applied to gate 37 causes inversion of the material in channel region 35 to provide a current path between source region 32 and drain 23.

However, the potential on the gate also causes an accumulation region 40 to form between cells. Thus, main transistor channel region 35, accumulation region 40, and current mirror channel region 35′ provide a continuous path between main transistor source region 32 and current mirror transistor source region 32′. While this would not be a problem between adjacent main cells, it can be a problem with current mirror cells and adjacent main cells. The resistance can be quite low and therefore can lead to crosstalk between the current mirror and the main switch, thus affecting the accuracy of the sensing.

FIG. 4 is a cross-sectional view showing the region between main transistor $T_1$ and current mirror $T_2$ according to the present invention. Isolation is provided by a row of isolation cells 50, each comprising a p/p+ body 52, formed in the same manner as p/p+ bodies 30 and 30′. However, the isolation cells are formed without an n+ source. This is accomplished simply during the manufacturing process by blocking the n+ diffusion in isolation cells 50 so that no source regions are formed. Body 52 is preferably tied to the source potential.

FIG. 5 is a top plan view illustrating an alternative technique for isolating main transistor $T_1$ and the current mirror $T_2$. Instead of individual cells for isolation, a continuous guard ring 55 is used. Guard ring 55 may have the same p/p+ doping profile and width as isolation cells 50, but it need not. In any event, it extends around the mirror cells, designated 57, to isolate them from the main cells, designated 58. If the mirror is at the edge of the active chip area, the guard ring need not extend all the way around. Multiple guard rings can also be used. The guard ring(s) are preferably tied to the source potential.

FIG. 6 is a schematic illustrating circuit connections for sensing current, voltage, temperature, and power. The sensing entails measuring voltage drops across resistors connected to source nodes $S_2$ and $S_3$. The resistors may be off the chip, or may be formed on the chip (e.g. polysilicon).

Current sensing is done in the manner of the prior art in that a resistor $R_2$ is connected between first current mirror source node $S_2$ and a common circuit node to which main transistor source node $S_1$ is connected. Resistor $R_2$ is a relatively low value resistor, compared to the on-resistance of transistor $T_2$, but still orders magnitude above the value of the power resistors that are necessary when current mirror techniques are not used. For current sensing, the current mirror should have enough cells to provide an adequate representation of the whole chip.

The current flowing in main transistor $T_1$ is determined on the basis of the ratio, designated $B_{12}$, of the current through main transistor $T_1$ to the current through current mirror transistor $T_2$, the value of resistor $R_2$, and the voltage appearing across resistor $R_2$ as follows:

$$I_2 = (V_2/R_2) \ldots \tag{1}$$

$$I_1 = B_{12}I_2 = B_{12}(V_2/R_2) \ldots \tag{2}$$

Equation 1 follows from Ohm's Law and Equation 2 follows from the current mirror ratio, and substitution of Equation 1.

Voltage sensing is accomplished by connecting a resistor $R_3$ having a value substantially greater than the on-resistance of current mirror transistor $T_3$. Since current mirror transistor $T_3$ contains so few cells and therefore conducts so little current, with the high resistance in series, the voltage across resistor $R_3$ will, to a great degree of accuracy, be equal to the voltage on the drain of transistor $T_3$ and, hence, on the drain of main transistor $T_1$. It should be noted that isolating the current mirror in the manner shown in FIG. 4 is not always necessary, and indeed may be dispensed with in the voltage sensing application where so little current is flowing.

Thus, the voltages appearing across resistors $R_2$ and $R_3$ are representative of the current through main transistor $T_1$ and the voltage across main transistor $T_1$.

The temperature of the chip may be determined by calculating the on-resistance of the chip and correlating that value with the known temperature dependence of the on-resistance. The on-resistance is readily calculated as follows:

$$R_{on} = V_D/I_1 \ldots \quad (3)$$

where the $V_D$ and $I_1$ are the voltage and current in the main transistor as determined on the basis of the current mirror sensings. For power MOS devices, $R_{on}$ increases with temperature in a very well known way which may be approximated by the following equation:

$$R_{on}(T) = R_{25}(1 + A(T-25)) \ldots \quad (4)$$

where $R_{on}(T)$ is the on-resistance at temperature T, $R_{25}$ is the on-resistance at 25° C., and A is the temperature dependence coefficient. The parameter A varies based on the voltage rating of the device, but for a given device type is almost constant with at most slight variations due to processing tolerances. For example, for 900 volt devices, $A = 0.01/°$ C. Equation 4 can be rearranged to yield temperature as a function of the measured value of $R_{on}$ and the parameters $R_{25}$ and A as follows:

$$T = 25 + (R_{on} - R_{25})/(AR_{25}) \ldots \quad (5)$$

This may be illustrated with a specific example where the chip is characterized as follows:

$N_1 = 10{,}000$; $N_2 = 10$; $N_3 = 2$; $B_{12} = 700$; $B_{13} = 3000$
$R_{25} = 0.5$ ohm; $A = 0.01/°$ C. where $N_1$, $N_2$, and $N_3$ are the numbers of cells in transistors $T_1$, $T_2$, and $T_3$, respectively. Assume that a load and power supply are connected to the common drain node D and that the external resistances are as follows:

$R_2 = 40$ ohms; $R_3 = 40$ kilohms

Consider first a situation where the following voltages are measured across resistors $R_2$ and $R_3$:

$V_2 = 0.2$ volts; $V_3 = 2.5$ volts.

Substituting the values into Equations 2, 3, and 5 gives:

$I_1 = (700)/(0.2/40) = 3.5$ amps
$R_{on} = (2.5)/(3.5) = 0.7$ ohm
$T = 25 + (.7 - .5)/(.01 * 0.5) = 65°$ C.

Consider next a situation where the measured voltages are $V_2 = 0.2$ volts; $V_3 = 3.5$ volts Substituting the values into Equations 2, 3, and 5 gives:

$I_1 = (700)(0.2/40) = 3.5$ amps $R_{on} = (3.5)/(3.5) = 1$ ohm $T = 25 + (1 - 0.5)/(.01 * 0.5) = 125°$ C.

The power being dissipated in the chip is given by the product of current and voltage, which at 65° C. equals 8.75 watts and at 125° C. equals 12.25 watts.

Note that in the examples, the on-resistances for the main transistor are 0.7 ohm at 65° C. and 1 ohm at 125° C. Therefore, the on-resistances for transistor $T_2$ are 490 ohm and 700 ohm and those for transistor $T_3$ are 2100 ohm and 3000 ohm. The resistance values for $R_2$ and $R_3$ need only satisfy the requirements that $R_2$ be substantially less than the on-resistance of transistor $T_2$ and that $R_3$ be substantially greater than the on-resistance of $T_3$.

FIG. 7 is a schematic illustrating circuit connections for sensing current, voltage, temperature, and power for an embodiment of the chip that contains a main transistor $T_1'$ and a single current mirror transistor $T_2'$. As in the case of the embodiment of FIGS. 1, 2, and 6, the main transistor and current mirror transistor have a common drain connection D'. The source $S_1'$ of main transistor $T_1'$ is connected to a common circuit node. The source node $S_2'$ of current mirror transistor $T_2'$ is coupled to the common circuit node through a resistor $R_3'$ and through the series connection of a low voltage analog switch SW and a resistor $R_2'$. Resistor $R_2'$ has a resistance substantially less than the on-resistance of transistor $T_2'$. Resistor $R_3'$ has a resistance substantially greater than the on-resistance of transistor $T_2'$.

When switch SW is open, source node $S_2'$ is coupled to the common node only through high value resistor $R_3'$, in which case the voltage at the source node, designated $V_3'$, is approximately equal to the voltage at drain node D', as described above in connection with FIG. 6. When switch SW is closed, the resistance to ground is the parallel combination of resistors $R_2'$ and $R_3'$ which is approximately equal to the resistance of $R_2'$. Therefore, the voltage $V_2'$ at the switch provides a measure of the current flowing through current mirror transistor $T_2'$ and hence main transistor $T_1'$. Each of resistors $R_2'$ and $R_3'$ and switch SW can be a discrete component off the chip, or can be integrated on the chip.

In conclusion, it can be seen that the present invention provides an improved current mirror construction for a power transistor wherein one or more current mirrors are integrated onto the same chip as the main transistor. Suitable connections to the source node permit accurate current and voltage sensing, from which other valuable information (temperature, power, on-resistance) may be obtained.

While the above is a complete description of the preferred embodiment in the present invention, various modifications, alternative constructions, and equivalents may be employed. Therefore, the above description and illustrations should not be taken as limiting the scope of the present invention which is defined by the appended claims.

I claim:

1. A power MOSFET comprising:
   a volume of semiconductor doped to a first conductivity type;
   first and second pluralities of MOSFET cells formed in respective first and second regions of said semiconductor volume, each MOSFET cell having a region doped to a second conductivity type opposite said first conductivity type and having a source region formed therein of said first conductivity type; and a plurality of isolation cells formed in a third region of said semiconductor volume disposed between said first and second regions, said isolation cells each having a region of said second conductivity type, but no source region.

2. A power MOSFET comprising:

a volume of semiconductor doped to a first conductivity type;

first and second pluralities of MOSFET cells formed in respective first and second regions of said semiconductor volume, each MOSFET cell having a region doped to a second conductivity type opposite said first conductivity type and having a source region formed therein of said first conductivity type; and a guard ring of said second conductivity type formed in a third region of said semiconductor disposed between said first and second regions.

3. A power MOSFET in combination with voltage sensing circuitry comprising:

a semiconductor volume;

first and second sets of MOSFET cells formed in respective first and second regions of said semiconductor volume, each cell having a source and drain between which current flow may be established, said first set of cells having a relatively large number of cells and said second set of cells having a much smaller number of cells;

each set of cells having commonly connected drains and commonly connected sources, the commonly connected drains of said first and second sets of cells having a common connection, the commonly connected source of said first set and said second set of cells being electrically isolated from each other to provide separate first and second source nodes; and a resistor having a resistance substantially greater than the on-resistance of said second set of cells, coupled between said second source node and said first source node for providing a voltage level that closely approximates the voltage level at the common drain connection.

4. The combination of claim 3 wherein said resistor is external to said semiconductor.

5. The combination of claim 3 wherein said resistor is formed on said semiconductor.

6. A power MOSFET in combination with current and voltage sensing circuitry comprising:

a semiconductor volume;

first, second and third sets of MOSFET cells formed in respective first, second and third regions of said semiconductor volume, each cell having a source and drain between which current flow may be established, said first set of cells having a relatively large number of cells and said second and third set of cells each having a much smaller number of cells;

each set of cells having commonly connected drains and commonly connected sources, the commonly connected drains of said first, second and third sets of cells having a common connection, the commonly connected source of said first set, said second set, and said third set of cells being electrically isolated from each other to provide separate first, second and third source nodes;

a first resistor having a resistance substantially less than the on-resistance of said second set of cells, coupled between said second source node and said first source node for providing a voltage at said second source node representative of the current flowing in said first set of cells; and a second resistor having a resistance substantially greater than the on-resistance of said third set of cells, coupled between said third source node and said first source node for providing a voltage at said third source node that closely approximates the voltage level at said common drain connection.

7. The combination of claim 6 wherein said third set of cells has fewer cells than said second set of cells.

8. The combination of claim 6 wherein at least one of said resistors is external to said semiconductor volume.

9. The combination of claim 6 wherein at least one of said resistors is formed on said semiconductor volume.

10. A power MOSFET in combination with current and voltage sensing circuitry, comprising:

a semiconductor volume;

first and second sets of MOSFET cells formed in respective first and second regions of said semiconductor volume, each cell having a source and drain between which current flow may be established, said first set of cells having a relatively large number of cells and said second set of cells having a much smaller number of cells;

each set of cells having commonly connected drains and commonly connected sources, the commonly connected drains of said first and second sets of cells having a common connection, the commonly connected source of said first set and said second set of cells being electrically isolated from each other to provide separate first and second source nodes; and means, having at least first and second states, for establishing (a) in said first state a first resistance, substantially less than the on-resistance of said second set of cells, between said second source node and said first source node so as to provide a voltage at said second source node that is representative of the current through said second set of cells, and (b) in said second state, a second resistance, substantially greater than the on-resistance of said second set of cells, between said second source node and said first source node so as to provide a voltage at said second source node that closely approximates the voltage level at the common drain connection.

11. The combination of claim 10 wherein said means for establishing comprises:

a first resistor having a resistance substantially less than the on-resistance of said second set of cells, coupled between an intermediate node and said first source node;

a second resistor having a resistance substantially greater than the on-resistance of said second set of cells, coupled between said second source node and said first source node; and a switch coupled between said second source node and said intermediate node, whereupon when said switch is closed, the resistance between said second source node and said first source node approximates the resistance of said first resistor and when said switch is open, the resistance between said second source node and said first source node equals the resistance of said second resistor.

* * * * *